(12) United States Patent  
Snyder

(10) Patent No.: US 7,360,851 B1  
(45) Date of Patent: Apr. 22, 2008

(54) AUTOMATED PATTERN RECOGNITION OF IMPRINT TECHNOLOGY

(75) Inventor: Bryan L. Snyder, Boise, ID (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 232 days.

(21) Appl. No.: 11/355,699

(22) Filed: Feb. 15, 2006

(51) Int. Cl.  
B41J 3/00 (2006.01)

(52) U.S. Cl. .......................................................... 347/2

(58) Field of Classification Search ................. 347/74, 347/43, 44, 2, 78, 75  
See application file for complete search history.

(56) References Cited

U.S. PATENT DOCUMENTS

| | | | | |
|---|---|---|---|---|
| 6,224,180 | B1 * | 5/2001 | Pham-Van-Diep et al. ...... | 347/2 |
| 6,900,881 | B2 | 5/2005 | Sreenivasan et al. .......... | 355/72 |
| 6,908,861 | B2 | 6/2005 | Sreenivasan et al. ........ | 438/694 |
| 6,916,584 | B2 | 7/2005 | Sreenivasan et al. .......... | 430/22 |
| 6,932,934 | B2 | 8/2005 | Choi et al. ................... | 264/496 |
| 7,104,634 | B2 * | 9/2006 | Weksler et al. ............... | 347/78 |
| 2005/0082253 | A1 | 4/2005 | Cherala et al. ............... | 216/44 |
| 2005/0084804 | A1 | 4/2005 | Truskett et al. .............. | 430/311 |
| 2005/0098534 | A1 | 5/2005 | Sreenivasan et al. .......... | 216/52 |
| 2005/0106321 | A1 | 5/2005 | McMackin et al. .......... | 427/258 |
| 2005/0160011 | A1 | 7/2005 | Sreenivasan et al. .......... | 705/26 |
| 2005/0160934 | A1 | 7/2005 | Xu et al. ..................... | 101/454 |
| 2005/0187339 | A1 | 8/2005 | Xu et al. ..................... | 524/556 |
| 2005/0189676 | A1 | 9/2005 | Sreenivasan ................. | 264/225 |
| 2005/0192421 | A1 | 9/2005 | Xu et al. ....................... | 528/23 |
| 2005/0230882 | A1 | 10/2005 | Watts et al. ................... | 264/96 |
| 2005/0270312 | A1 | 12/2005 | Lad et al. ....................... | 374/1 |
| 2005/0270516 | A1 | 12/2005 | Cherala et al. ................ | 355/72 |
| 2005/0276919 | A1 | 12/2005 | Truskett et al. ............. | 427/230 |
| 2006/0017876 | A1 | 1/2006 | Watts .......................... | 349/152 |

FOREIGN PATENT DOCUMENTS

WO        WO2005120834        12/2005

OTHER PUBLICATIONS

"Step and Repeat—Step and Flash Imprint Lithography" downloaded from the Internet, downloaded from: <http://www.molecularimprints.com/Technology/stepandrepeat.html> on Feb. 15, 2006.

* cited by examiner

*Primary Examiner*—K. Feggins  
(74) *Attorney, Agent, or Firm*—Joshua D. Isenberg; JDI Patent

(57) ABSTRACT

An apparatus and method for control of spreading of liquid drops are disclosed. An initial pattern of drops of liquid is deposited on a first surface. A second surface is brought into sufficient contact with the initial pattern of the drops that the liquid starts to spread. Two or more digital images of the liquid are captured after it begins to spread. A digital analysis is performed on these images to determine whether one or more portions of the initial pattern of drops require more or less liquid. A subsequent pattern of liquid droplets is adjusted based on the digital analysis.

22 Claims, 6 Drawing Sheets

AUTOMATED PATTERN RECOGNITION OF IMPRINT TECHNOLOGY

FIELD OF THE INVENTION

This invention generally relates to imprint lithography and more particularly to the use of automated pattern recognition in to adjust resist droplet patterns in imprint lithography.

BACKGROUND OF THE INVENTION

Nano-imprint lithography is based on embossing adapted to the needs of semiconductor processing. Nano-imprint lithography is essentially a micromolding process in which the topography of a template patterns a photoresist on a wafer. In photolithography, by contrast, the resist is patterned by optical exposure and development. Unlike photolithography, imprint lithography does not use reduction optics. Instead, the size of the template determines the size of the pattern. Thus masks for nano-imprint lithography are often referred to as 1X masks. One advantage of nano-imprint lithography is that the parameters that limit resolution in classic photolithography (including wavelength and numerical aperture) do not apply. Nano-imprint lithography resolution is primarily limited by the resolution of the template fabrication process.

One type of nano-imprint lithography is based on the ancient craft of embossing, with an adaptation to modern semiconductor needs. The technique uses a template, e.g., made of fused silica, with a circuit pattern etched into a raised portion of the template referred to as a mesa. The pattern may be etched into the surface of the mesa using an e-beam writer. A pattern of drops of a low viscosity, silicon-containing monomer is deposited on a substrate (e.g., a semiconductor wafer). The patterned surface of the template is gently pressed into the monomer drops on the substrate. The monomer fluid fills spaces in the pattern etched in the template. The monomer is then polymerized into a hard material, e.g., by exposure to ultraviolet (UV) radiation. The patterned surface of the template may be covered with a release layer to facilitate separation of the template from the hardened polymer. Upon separation of the template, the circuit pattern is left on the surface. A residual layer of polymer between features in the pattern may removed by an etch process, and a replica of the pattern may then be used in semiconductor processing for etch or deposition. It is possible to make features as small as 20 nm with this technique.

One problem with the above technique occurs as a result of non-uniform spreading of the monomer drops after contact with the patterned surface of the mesa. The drops are typically deposited using a computer controlled dispenser similar to an ink-jet printer. The localized spreading of the drops is partly dependent on the density of features in the circuit pattern oil the mesa. The pattern of monomer drops often must be adjusted manually to compensate for variations in feature density. Unfortunately, such manual adjustment is difficult and slow, which increases cost and reduces yield.

Thus, there is a need in the art, for a method of compensating for variations in the drop spreading that overcomes the above disadvantages.

SUMMARY OF THE INVENTION

An embodiment of the invention relates to a method for control of spreading of liquid drops. An initial pattern of drops of liquid is deposited on a first surface. A second surface is brought into sufficient contact with the initial pattern of the drops such that the liquid starts to spread. Two or more digital images of the liquid are captured after the liquid begins to spread. A digital analysis is performed on these images to determine whether one or more portions of the initial pattern of liquid droplets require more or less liquid. A subsequent pattern of liquid drops is adjusted based on the digital analysis.

Another embodiment of the invention relates to an apparatus for control of spreading of liquid drops. The apparatus includes a drop dispenser that can form an initial pattern of liquid drops on a first surface, a mechanism that can bring a second surface into sufficient contact with the drops such that they begin to spread, an image capture device that can capture two or more images of the drops after they begin to spread and a controller configured to analyze the images and determine whether one or more portions of the initial pattern require more or less liquid and adjust a subsequent pattern of drops accordingly.

BRIEF DESCRIPTION OF THE DRAWINGS

Other objects and advantages of the invention will become apparent upon reading the following detailed description and upon reference to the accompanying drawings in which.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

Figure 1A:
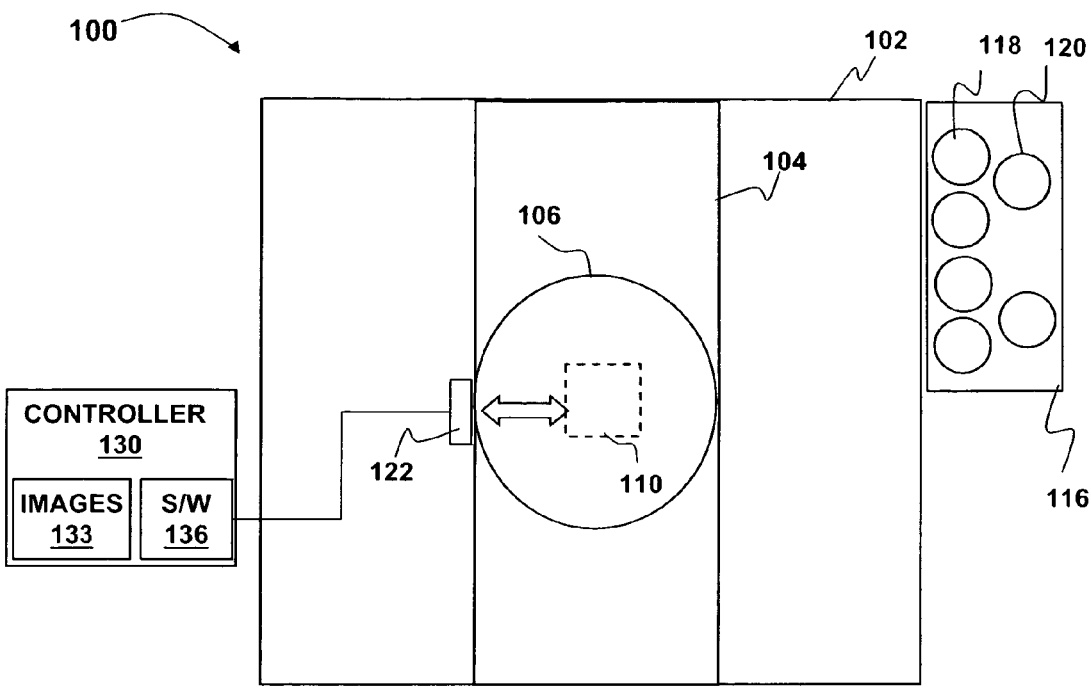
FIGS. 1A-1B are schematic diagrams of an apparatus according to an embodiment of the present invention.
Figure 1B:
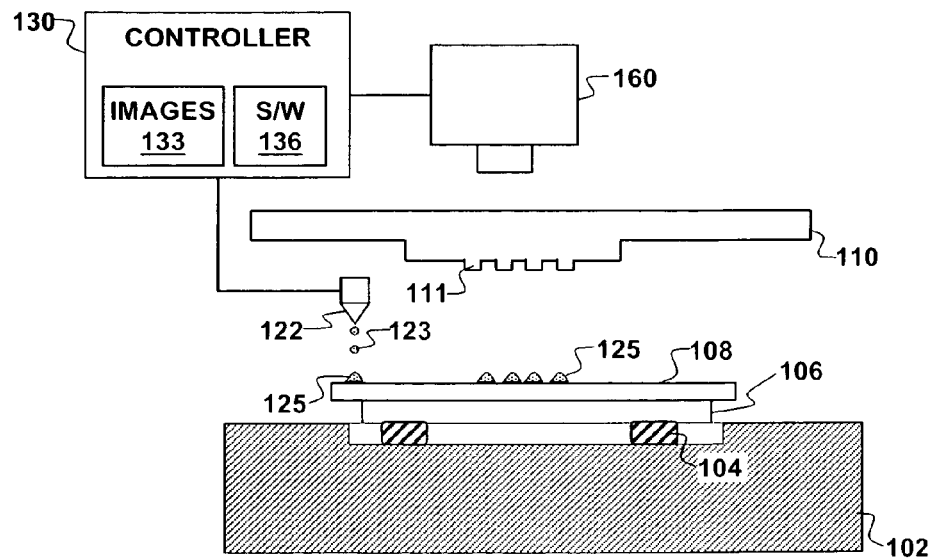

According to a first embodiment of the present invention, an apparatus for control of spreading of liquid drops is shown in FIGS. 1A-1B. The apparatus 100 one or more image capture devices such as one or more digital cameras 160 coupled to a controller 130. The apparatus 100 also includes a granite stage 102 and a carriage 104 placed on the granite stage 102. The carriage 104 carries a chuck 106. A substrate 108 such as a semiconductor wafer is placed on the chuck 106. The system 100 also includes a droplet dispenser 122, e.g., a parallel print head. The droplet dispenser 122 dispenses droplets 123 of a liquid monomer onto the substrate 108 to form drops 125. Each drop 125 may be made of one or more droplets 123. The monomer may be stored in cartridges 118 and retrieved from a monomer cabinet 116. By way of example, the liquid monomer may be a UV-curable monomer suitable for use in nano-imprint lithography. Suitable monomers are available, e.g., from Molecular Imprints, Inc. of Austin Tex. A second surface in the form of a patterned surface 111 of a nano-imprint lithography template 110 may be brought into contact with the pattern of drops 125, e.g., by lowering the template 110 until it contacts the drops 125. The positioning of the template 110 may be controlled in response to signals from the controller 130. Although FIG. 1B depicts the template 110 being lowered towards the substrate 108, the substrate 108 may alternatively be raised to bring the drops 125 on the substrate 108 into contact with the template 110. Other configurations for bringing the template 110 into contact with the drops 125 are within the scope of embodiments of the present invention.

A digital camera 160 is placed in a proper position so it can take the digital images of the spreading of the monomer drops 125 after the template 110 is in contact with them. The template 110 may be made of a transparent material such as quartz, and the camera may capture images of the spreading drops through the transparent template 110. In alternative embodiments, the substrate 108 may be transparent and the digital camera 160 may be placed to view the drop pattern through the substrate 108. In the example shown in FIG. 1B, the digital camera 160 is placed above the template 110 looking down on the drop pattern on the substrate 108 through the template 110. However, in alternative embodiments, the locations of the template 110 and substrate 108 may be reversed and the camera 160 may view the drop pattern from below. It is noted that embodiments of the present invention allow for different camera positions, orientations and magnifications to facilitate viewing of different portions of the apparatus 100 from different angles.

Preferably, the digital camera 160 has sufficient resolution to capture sufficient detail of the spreading of the drops 125. By way of example and without limitation, the digital camera 160 may be a monochrome or color digital camera having a resolution greater than or equal to about 1.3 megapixels or greater than or equal to about 6.6 megapixels.

Figure 1C:
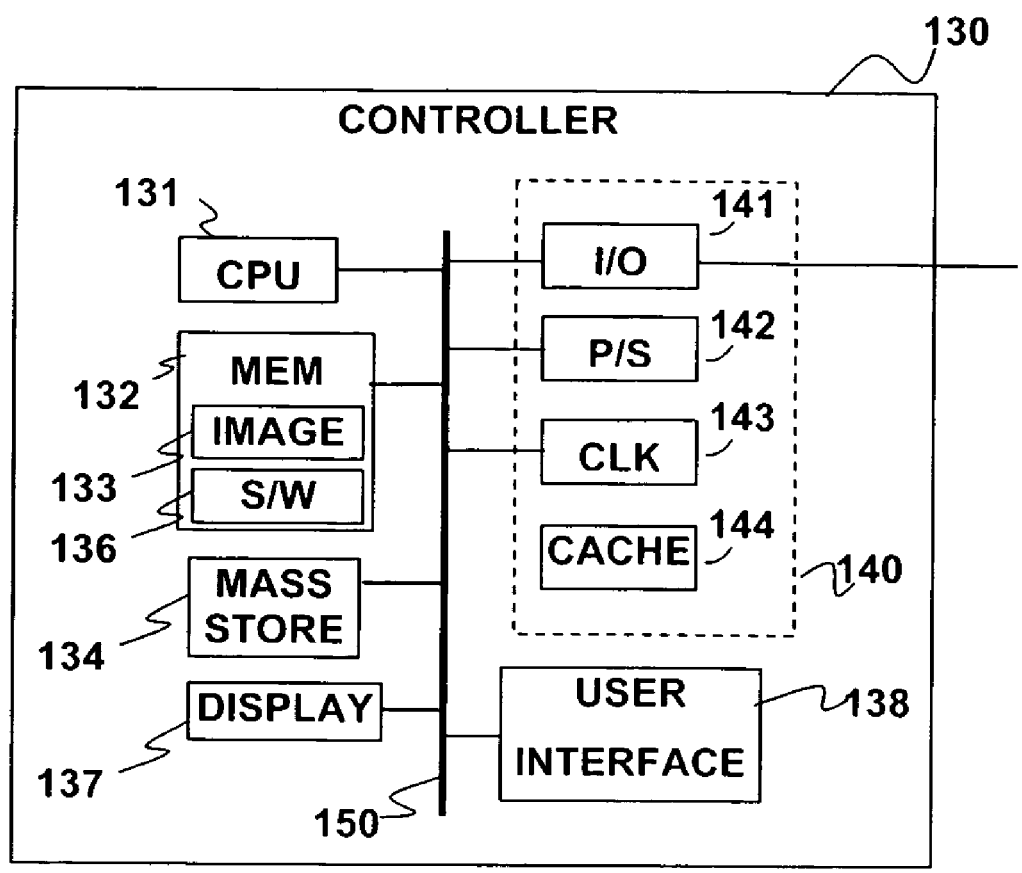
FIG. 1C is a schematic diagram of a controller that may be used with the apparatus of FIGS. 1A-1B.

The camera 160, dispenser 122, and carriage 104 may all operate under control of the controller 130. As shown in FIG. 1C, the controller 130 may include a central processor unit (CPU) 131 and a memory 132 (e.g., RAM, DRAM, ROM, and the like). The memory may contain one or more images 133 and software 136. The apparatus 100 may operate under the control of the software 136 when implementing methods for control of droplet spreading according to embodiments of the present invention as discussed below. The controller 130 may also include well-known support circuits 140, such as input/output (I/O) circuits 141, power supplies (P/S) 142, a clock (CLK) 143 and cache 144. Other components of the apparatus 100 such as the carriage 104, chuck 106, the droplet dispenser 122, and digital camera 160 may exchange signals with the controller 130 via the I/O circuits 141.

The controller 130 may optionally include a mass storage device 134 such as a disk drive, CD-ROM drive, tape drive, or the like to store programs and/or data. The controller may also optionally include a display unit 137 and user interface unit 138 to facilitate interaction between the controller 130 and a user. The display unit 137 may be in the form of a cathode ray tube (CRT) or flat panel screen that displays text, numerals, or graphical symbols. The user interface 138 may include a keyboard, mouse, joystick, light pen or other device. The preceding components may exchange signals with each other via an internal system bus 150. The controller 130 may be a general purpose computer that becomes a special purpose computer when running code that implements embodiments of the present invention as described herein.

By way of example, the apparatus 100 may be a nano-imprint lithography system having a controller that may be programmed to implement embodiments of the present invention. An example of a suitable nano-imprint lithography system is an Imprio® 250 or Imprio® 300 imprint lithography system available from Molecular Imprints, Inc. of Austin Tex. Imprio® M is a registered trademark of Molecular Imprints, Inc. of Austin Tex.

Figure 2:
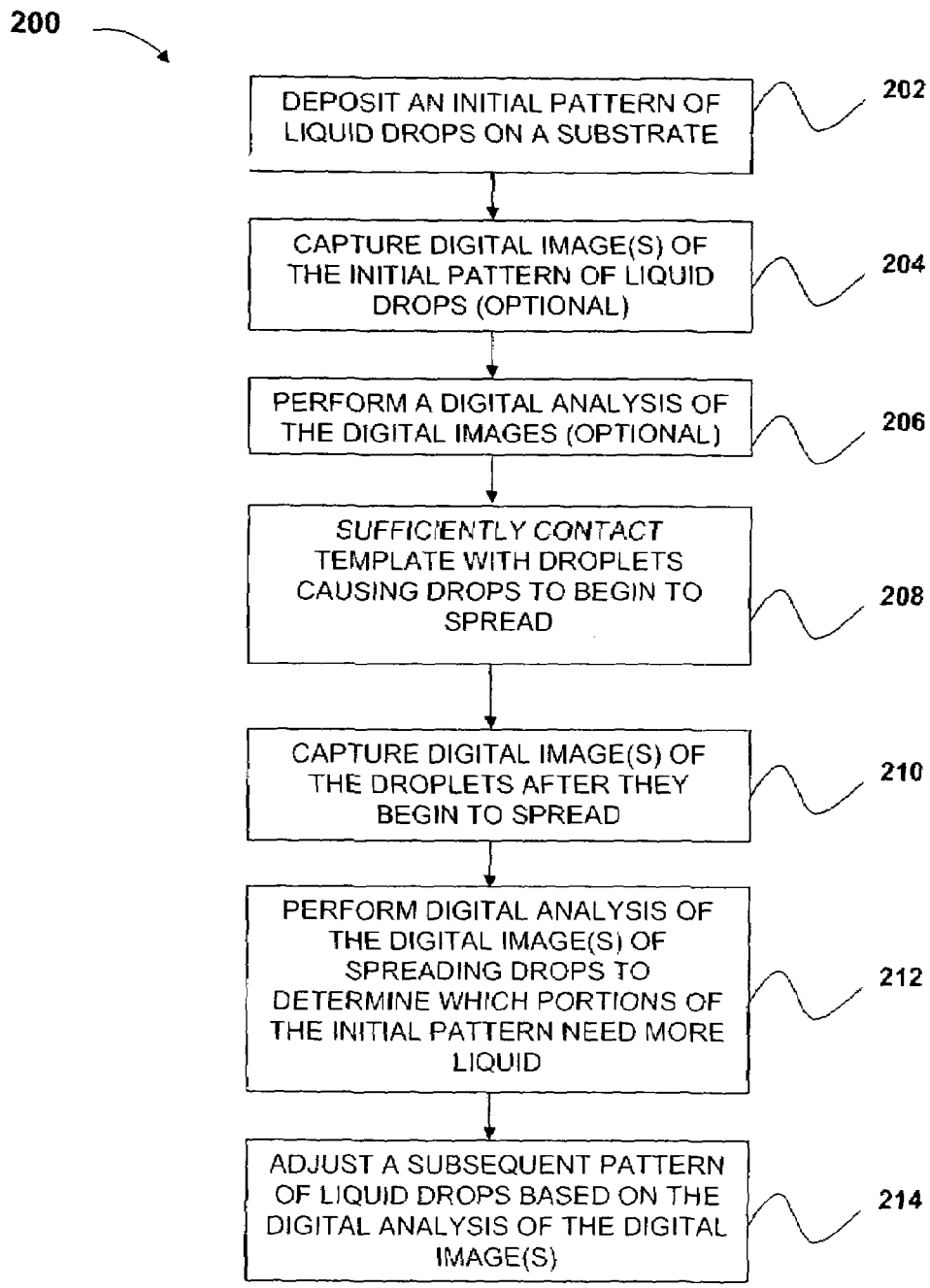
FIG. 2 is a flow diagram illustrating a method for control of spreading of liquid drops according to an embodiment of the present invention.

FIG. 2 is a flow diagram illustrating an example of a method 200 for control of spreading of liquid droplets according to a prefer embodiment of the present invention. The method 200 may be implemented by the controller 130 executing a sequence of processor executable instructions of the software 136 that control the apparatus 100. At 202, liquid droplets (e.g. monomer droplets 123) are deposited on a surface of the substrate 108 by the droplet dispenser 122 to form a pattern of drops 125. One or more digital images of an initial pattern of the liquid drops 125 on the substrate 108 may optionally be captured by the digital camera 160 at 204. The digital images of the initial pattern may optionally be analyzed by the software 136 at 206. At 208, the template 110 is brought into sufficient contact with the initial pattern of the liquid drops 125 on the substrate 108 and the liquid drops 125 begin to spread. One or more digital images 133 of the liquid drops after they start to spread are captured at time intervals at 210. By way of example, images may be taken at three or four intervals during the first 10 seconds after the template 110 contacts the initial drops 125.

After the images 133 have been captured, the software 136 performs a digital analysis of the digital images 133 and determines which portions of the initial pattern need more liquid at 212. The digital analysis determines the locations to which the liquid has spread. Based on the digital analysis of the digital images 133, a subsequent pattern of liquid droplets may be automatically adjusted at 214. The subsequent pattern of droplets may be formed on the substrate 108 at a different location than a location of the initial pattern (e.g., at a location of a different die). The adjustment of the subsequent pattern may involve variations in the number and location of droplets 123 that form the drops 125 in the subsequent pattern or variation in the flow rate to adjust the size of the droplets 123 that form the drops 125 in the subsequent pattern or some combination of these. By way of example, the subsequent pattern may be adjusted by increasing a rate of flow of the liquid droplets 123 at the portions correspond to the locations on the substrate or the template surface where the liquid drops 125 did not spread after bringing the template into sufficient contact with the drops 125 at 208. As a result, the size of the drops at these locations is bigger than the size of drops at other locations on the subsequent pattern. In some embodiments the subsequent pattern may be adjusted by adjusting a flow rate for all of the droplets within the portion according to a predicate. The predicate may be applied to low or high zone areas based on the topography of the template 110.

Figure 3A:
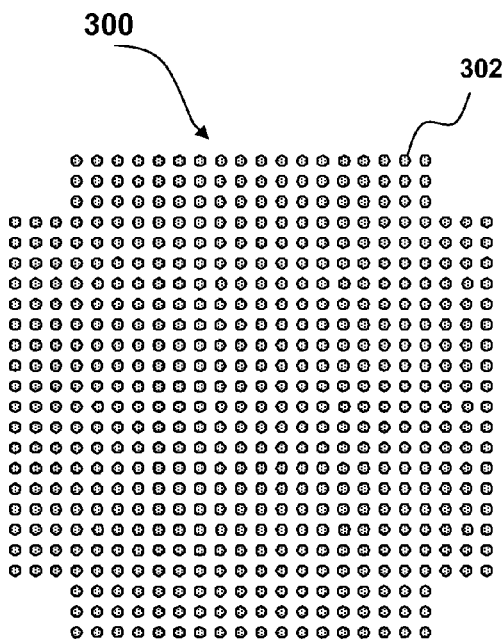
FIGS. 3A-3H are a series of schematic diagrams illustrating spreading of liquid drop patterns after contact with a template and adjustment of a subsequent drop pattern according to embodiments of the present invention.
Figure 3B:
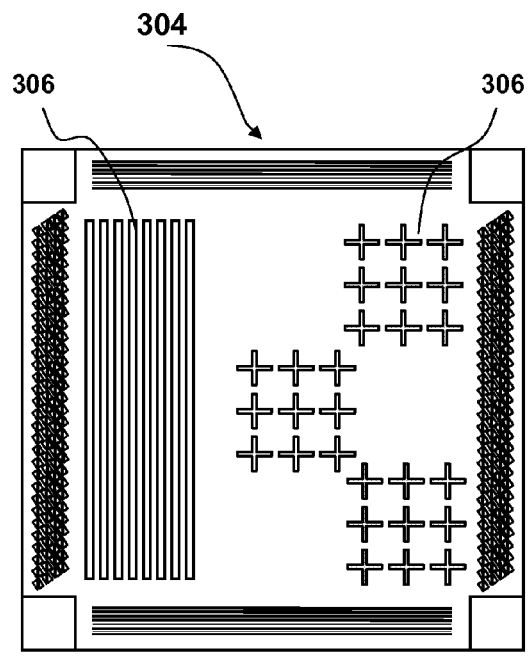
Figure 3C:
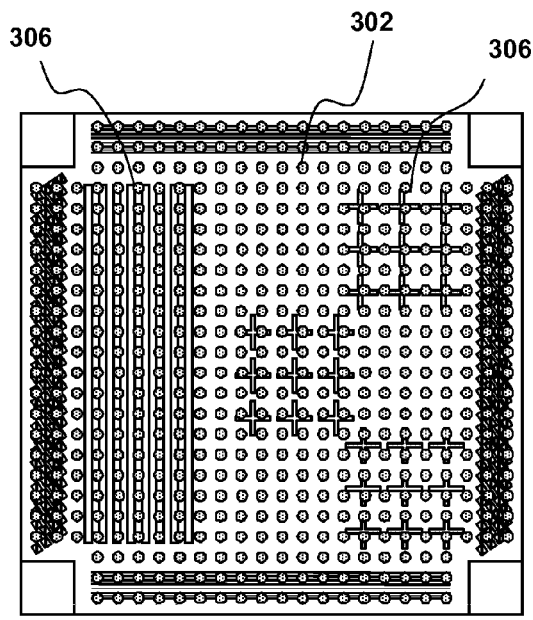
Figure 3D:
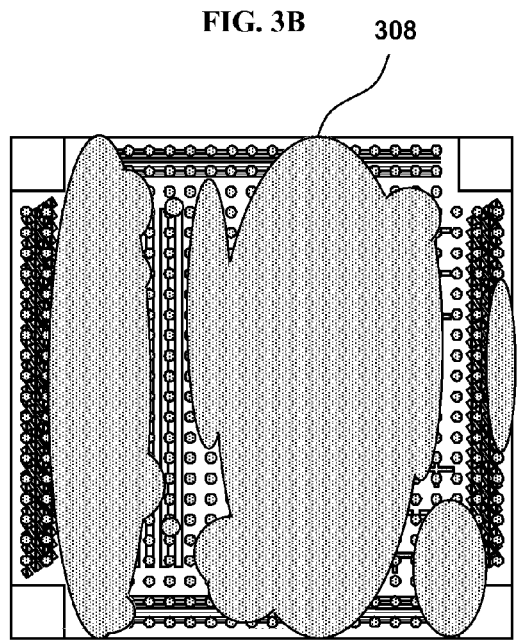
Figure 3E:
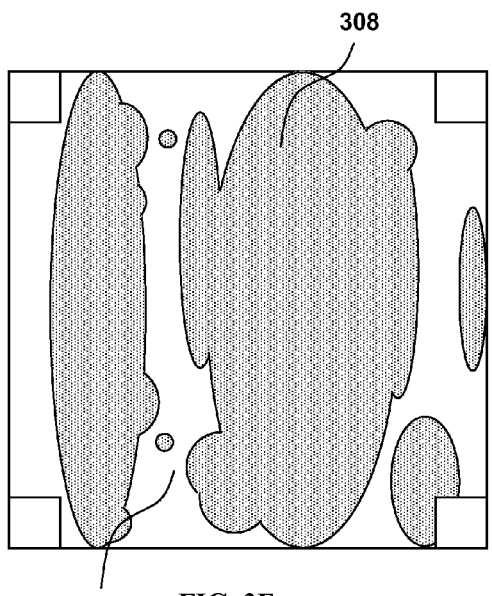
Figure 3F:
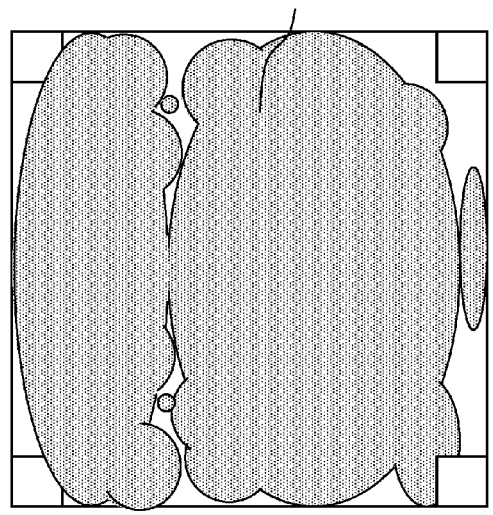
Figure 3G:
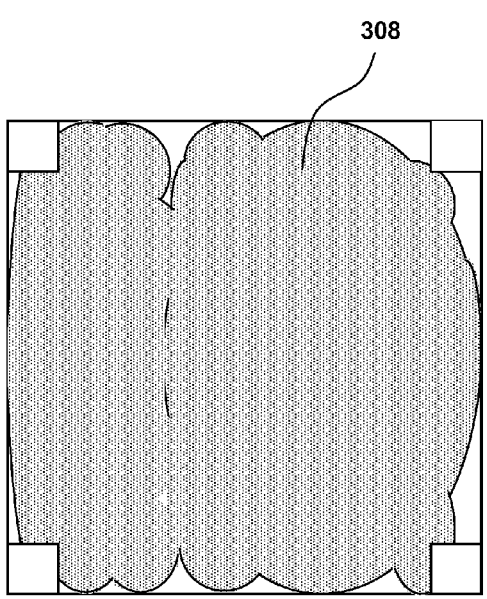

FIGS. 3A-3H are a sequence of schematic diagrams illustrating spreading of droplet patterns after contact with a template corresponding to the method described in FIG. 2. FIG. 3A illustrates an initial pattern 300 of liquid drops 302 that may be formed on a portion of a substrate, e.g., a die of a semiconductor wafer. In the example depicted in FIG. 3A, all the drops 302 are the same size. FIG. 3B illustrates a nano-imprint lithography template 304 with features 306 that is to be brought into contact with the droplet pattern 300. FIG. 3C illustrates the superposition of the template 304 with the initial pattern 300 just prior to bringing the template 304 into contact with the initial pattern 300. FIG. 3D shows a pattern of a liquid film 308 (indicated by the shaded pattern) that forms as the drops 302 spread after the template 304 and the initial pattern 300 are in contact for about 1 to 3 seconds. FIGS. 3E-3G illustrate examples of digital images of the droplet patterns captured at intervals during the first 10 seconds after the template 304 in contact with the initial pattern 300.

Figure 3H:
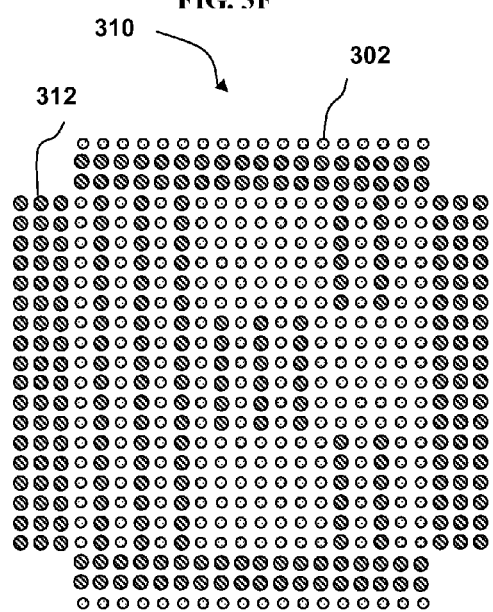

To analyze the images the software 136 may divide the images 133 up into arrays of pixels. A number of different image properties, such as intensity, color, contrast and the like may be associated in software with each pixel. Digital analysis of the pixels may reveal gaps 309 (indicated as un-shaded portions of the image) in the pattern of the spreading liquid 308 at different stages of the spreading. By way of example, the image analysis performed by the software 136 may recognize these gaps 309 from the contrast in intensity or other image properties for pixels in the gaps 309 compared to pixels for nearby portions of the liquid 308. To adjust the subsequent pattern of liquid drops the software 136 may direct the dispenser 122 to provide a higher flow or number of droplets for drops in locations corresponding to the gaps 309 or nearby portions of the substrate in a subsequent pattern of droplets (e.g., a pattern for a subsequent imprint using the same template 304 on a different portion of the same substrate or on an entirely different substrate). FIG. 3H shows an example of a subsequent pattern 310 of liquid drops 302 and 312, which is determined after the pattern recognition software has performed a digital analysis of the digital images shown in FIGS. 3E-3G. As shown in FIG. 3H the drops 312 are bigger than droplets 302 corresponding to the increasing of the flow rate of the liquid droplets that make up the drops 312. The larger drops 312 may be located in regions of the substrate corresponding to the gaps 309 in the images of FIGS. 3E-3G.

Figure 4A:
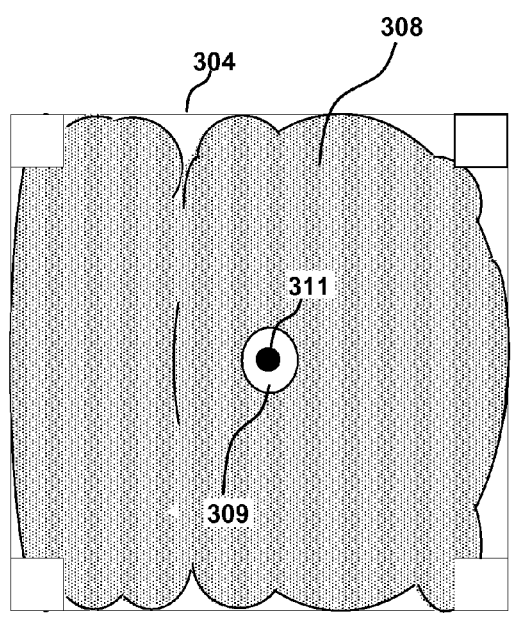
FIGS. 4A-4F are a series of schematic diagrams illustrating removal of a particle from a template according to an embodiment of the present invention.
Figure 4D:
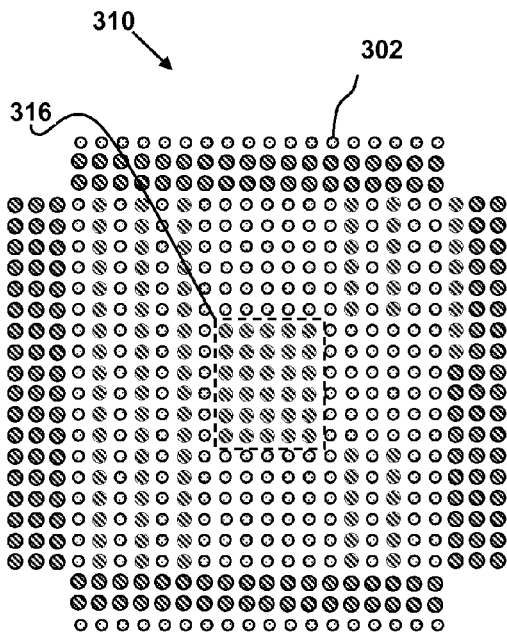
Figure 4B:
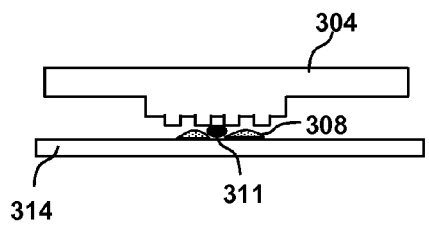
Figure 4E:
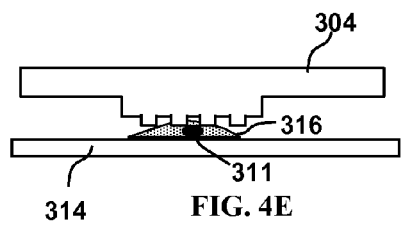
Figure 4C:
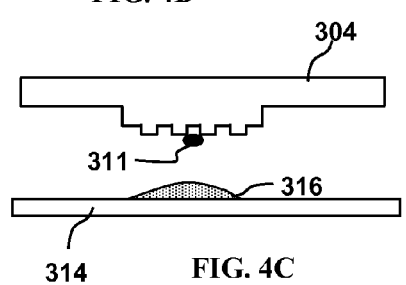
Figure 4F:
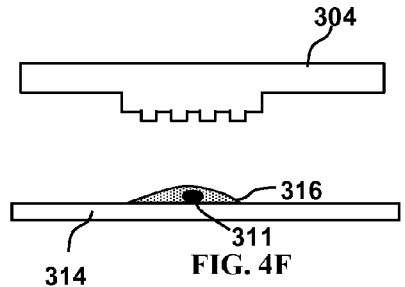

In alternative embodiments of the invention, an increase in the rate of flow of the liquid droplets may be applied to remove particles from the template 304. FIGS. 4A-4F illustrate an example of such particle removal. As shown in FIGS. 4A-4B, one of the images taken after spreading begins the liquid pattern 308 may show a gap 309 due to a particle 311. In this situation, the flow rate of the liquid droplets may be increased at a position corresponding to the location of the gap 309 in a subsequent pattern of drops 316 on a substrate 314 as shown in FIGS. 4C-4D. The subsequent pattern 316 may be formed on a different die or at an off wafer site for doing particle removal. Due to the increased amount of liquid in the vicinity of the particle 309 when the template 304 contacts the subsequent pattern of drops 316, the particle 311 will hold to the liquid as shown in FIG. 4E. To secure the particle 311 to the substrate 314, the liquid may be hardened, e.g., by exposure to UV, etc. When the template 304 separates from contact with the subsequent pattern of liquid drops 316 the particle 311 remains stuck to the substrate 314 and is therefore removed from the template 304 as shown in FIG. 4F. Any die that was imprinted with the template 304 with the particle 311 may be flagged as a "bad die" in subsequent processing.

Embodiments of the present invention provide for higher throughput and reduced cost in imprint lithography. The automatic adjustment of the droplet pattern based on images of the spreading of prior droplet patterns allows for faster imprint lithography than was possible with manual adjustment of the droplet pattern. Once the droplet pattern has been adjusted based on the digital images the droplets spread more quickly and more evenly. Subsequent patterns of liquid may be imprinted and hardened (e.g., by UV exposure through the template) more quickly and with a higher yield than previously obtainable using manual droplet pattern adjustment.

Although the preceding examples describe embodiments that related to imprint lithography, embodiments of the present invention are not to be limited by these examples. For example, the process and apparatus described herein may be applied to embodiments where a pattern of droplets of adhesive are formed on a substrate for the purpose of adhering lenses or layers of transparent material or applying a layer of transparent liquid material in such a way that there are no bubbles.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A method for control of spreading of liquid droplets, comprising:
    depositing an initial pattern of drops of a liquid on a first surface;
    bringing a second surface into sufficient contact with at least a portion of the initial pattern of drops on the first surface that the liquid begins to spread;
    capturing one or more digital images of the liquid after it begins to spread;
    performing a digital analysis of the one or more images to determine whether one or more portions of the initial pattern of drops require more liquid; and
    adjusting a subsequent pattern of drops of liquid based on the digital analysis of the two or more images.

2. The method of claim 1, further comprising bringing the second surface into contact with the subsequent pattern.

3. The method of claim 1 wherein the second surface is a patterned surface of a nano-imprint lithography template.

4. The method of claim 1, wherein the one or more images include two or more digital images captured at an interval of greater than about 1 second between subsequent images.

5. The method of claim 1, further comprising the step of capturing one or more initial digital images of the initial pattern of drops of the liquid before bringing the second surface into sufficient contact with at least a portion of the pattern of drops, wherein performing a digital analysis of the one or more images includes performing a digital analysis of the one or more initial digital images.

6. The method of claim 1, wherein adjusting the subsequent pattern of drops includes increasing a rate of flow and/or a number of droplets for one or more portions of the subsequent pattern that correspond to one or more locations on the first or second surface where the liquid did not spread after bringing the second surface into sufficient contact with at least a portion of the initial pattern of drops.

7. The method of claim 1, wherein adjusting the subsequent pattern of drops includes increasing a rate of flow for a drop located at a position corresponding to a location of a particle on the second surface, bringing the second surface into contact with the subsequent pattern, and separating the second surface from contact with the subsequent pattern, wherein the increased flow is sufficient such that the particle holds to the liquid when the second surface separates from contact with the subsequent pattern.

8. The method of claim 1 wherein the subsequent pattern of drops is formed on the first surface at a different location than a location of the initial pattern.

9. The method of claim 1 wherein capturing the two or more digital images includes capturing three or more digital images over a period of about ten seconds after bringing the second surface into sufficient contact with at least a portion of the initial pattern of drops.

10. The method of claim 1 wherein adjusting the subsequent pattern includes adjusting a flow for droplets forming the drops within a portion of the subsequent pattern according to a predicate.

11. The method of claim 1 wherein the second surface is a patterned surface of a nano-imprint lithography template, the method further comprising bringing the patterned surface into sufficient contact with the subsequent pattern of droplets of the liquid to spread the drops into a liquid film.

12. The method of claim 11, further comprising the step of hardening the liquid film to form a hardened film.

13. The method of claim 12, further comprising the step of separating the patterned surface from the hardened film.

14. The method of claim 1 wherein performing a digital analysis of the two or more images includes identifying one or more locations in one or more of the two or more images where the liquid did not spread.

15. The method of claim 1 wherein the first or second surface is a surface of a transparent material, wherein capturing one or more digital images of the liquid includes viewing the liquid through the transparent material.

16. An apparatus for control of spreading of liquid droplets, comprising:
   a droplet dispenser configured to form an initial pattern of drops of liquid on a first surface;
   means for brining a second surface into sufficient contact with at least a portion of the initial pattern of drops on the first surface that the liquid begins to spread;
   a camera configured to capture one or more digital images of the liquid after it begins to spread; and
   a controller coupled to the droplet dispenser and the camera, the controller having a processor and a processor readable medium having embodied therein processor executable instructions, including
   an instruction for performing a digital analysis of the two or more digital images to determine whether one or more portions of the initial pattern of liquid drops require more liquid; and
   an instruction for adjusting a subsequent pattern of drops based on the digital analysis of the two or more images.

17. The apparatus of claim 16, wherein the second surface is a patterned surface of a nano-imprint lithography template.

18. The apparatus of claim 16 wherein the camera is a digital camera.

19. The apparatus of claim 18 wherein the digital camera has a resolution of greater than or equal to about 1.3 megapixels.

20. The apparatus of claim 18 wherein the digital has a resolution of greater than or equal to about 6.6 megapixels.

21. The apparatus of claim 16 wherein the first or second surface is a surface of a transparent material.

22. The apparatus of claim 21 wherein the camera is positioned to view the liquid through the transparent material.

* * * * *